(12) United States Patent
Takeuchi et al.

(10) Patent No.: US 6,307,148 B1
(45) Date of Patent: Oct. 23, 2001

(54) COMPOUND SEMICONDUCTOR SOLAR CELL AND PRODUCTION METHOD THEREOF

(75) Inventors: Kenji Takeuchi; Yoshio Onuma; Sumihiro Ichikawa, all of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/535,246

(22) Filed: Mar. 27, 2000

(30) Foreign Application Priority Data

| Mar. 29, 1999 | (JP) | 11-086792 |
|---|---|---|
| Sep. 7, 1999 | (JP) | 11-252550 |
| Sep. 7, 1999 | (JP) | 11-253038 |
| Dec. 24, 1999 | (JP) | 11-367039 |
| Dec. 24, 1999 | (JP) | 11-367687 |

(51) Int. Cl.$^7$ .................................. H01L 31/032

(52) U.S. Cl. .................. 136/264; 136/252; 136/262; 136/265; 257/461; 257/464; 438/93; 438/94; 438/95; 438/85; 438/86

(58) Field of Search .................. 136/252, 262, 136/264, 265; 257/461, 464; 438/93, 94, 95, 85, 86

(56) References Cited

U.S. PATENT DOCUMENTS

5,676,766    10/1997    Probst et al. .................. 136/265

FOREIGN PATENT DOCUMENTS

| 0 360 403 A2 | 3/1990 | (EP) . |
| 0 798 786 A2 | 1/1997 | (EP) . |

OTHER PUBLICATIONS

Chen et al, "Development of Thin Film Polycrystalline CuIn1–xGaxSe2 Solar Cells," 19th IEEE Photovoltaic Specialists Conference, May 4–8, 1987, pp. 1445–1447.*

Klenk et al, "Wide Bandgap Cu(Ga,In)Se2/(Zn,Cd)S Heterojunctions," 20th IEEE Photovoltaic Specialists Conference, Sep. 26–30, 1988, pp. 1443–1447.*

Klenk et al, "Improvement of Cu(Ga,In)Se2 Based Solar Cells by Etching the Absorber," 21st IEEE Photovoltaic Specialists Conference, May 21–25, 1990, pp. 481–486.*

Ogawa et al, "Influence of KCN treatment on CuInS2 thin films," Applied Surface Science, 92, pp. 232–236, 1996.*

Takeuchi et al, "Characterization of Large Grain Size CuInS2 Solar Cells," Royton Sapporo (11th International Photovoltaic Science and Engineering Conference), pp. 831–832, Sep. 20–24, 1999.*

"Low Pressure Vapor Phase Selenization of Cu–In Films Without H$_2$Se, " J. Kessler et al., 10$^{th}$ European Photovolaic Solar Energy Conference, pp. 879–882. (Date Unknown).

(List continued on next page.)

Primary Examiner—Alan Diamond
(74) Attorney, Agent, or Firm—Pennie & Edmonds LLP (57) ABSTRACT

An indium layer and a copper layer, and whenever necessary, a gallium layer or a gallium-alloy layer, are laminated on an electrode film formed on one of the surfaces of a substrate to form a metallic film. The metallic film is then subjected to sulfurization treatment or selenization treatment to form a p-type semiconductor layer made of "CuInS$_2$ or CuInSe$_2$" or "Cu(In, Ga)S$_2$ or Cu(In, Ga)Se$_2$". This p-type semiconductor layer is subjected to KCN treatment, for removing impurities such as copper sulfide, copper selenide, etc., by a KCN solution, and an n-type semiconductor layer is formed on this p-type semiconductor layer to form a solar cell. In this instance, the indium layer is formed under heating, or is heat-treated by heat-treatment while the surface of the indium layer is exposed.

23 Claims, 7 Drawing Sheets

OTHER PUBLICATIONS

"Preparation of CuInSe$_2$ Thin Films Using Electrodeposited In/Cu Metallic Layer," Y.H. Kim et al., *IEEE*, Apr. 1994, pp. 202–205.

"Efficient CuInS$_s$ Thin–Fim Solar Cells Prepared By A Sequential Process," J. Klaer et al., *Semicond. Sci. Technol.*, 1998, vol. 13, pp. 1456–1458.

"Characterization of Cu–In–Ga Precursors Used To Form Cu(In, Ga)Se$_2$ Films," M. Marudachalam et al., *IEEE*, Apr. 1994, pp. 234–237.

"Chemical Reaction Analysis of Copper Indium Selenization," V. Sandeep et al., *Progress In Photovoltaics: Research and Applications*, 1996, vol. 4, pp. 341–353.

Royton Sapporo, Technical Digest (11th International Photovoltaic Science and Engineering Conference) Sep. 20–24/1999), pp. 831–832.

* cited by examiner

COMPOUND SEMICONDUCTOR SOLAR CELL AND PRODUCTION METHOD THEREOF

BACKGROUND OF THE INVENTION

1. Field of the Invention

This invention relates to a compound semiconductor solar cell and a production method thereof. More particularly, it relates to a compound semiconductor solar cell having a p-n junction and a production method thereof.

2. Description of the Related Art

Figure 6A:
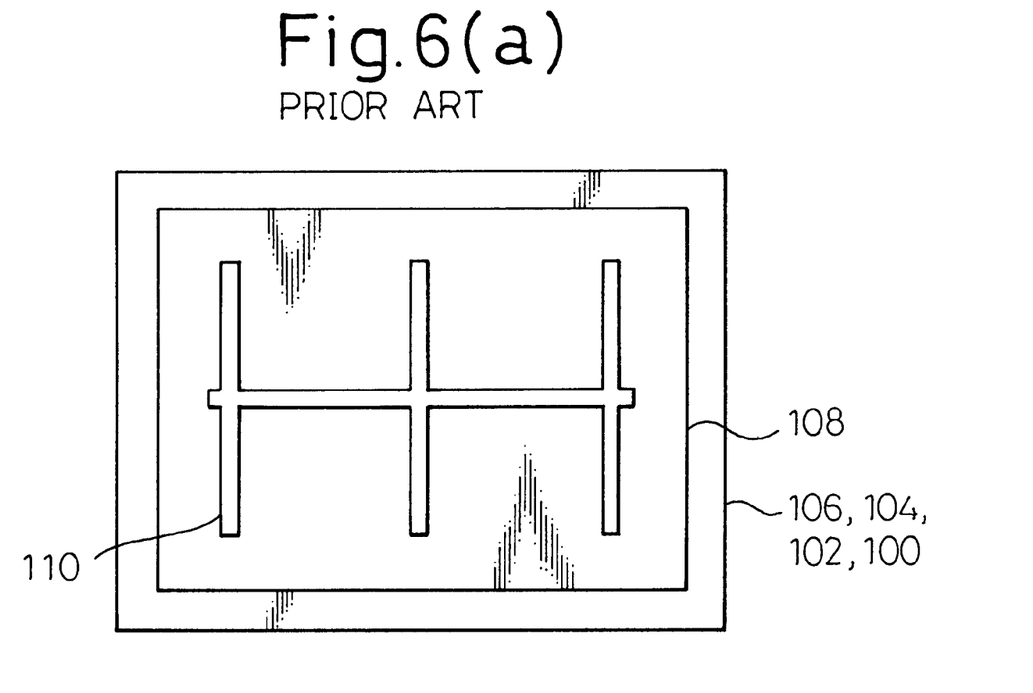
FIGS. 6(a) and 6(b) are a front view (a) and a longitudinal sectional view (b) useful for explaining an example of a compound semiconductor solar cell according to the prior art.
Figure 6B:
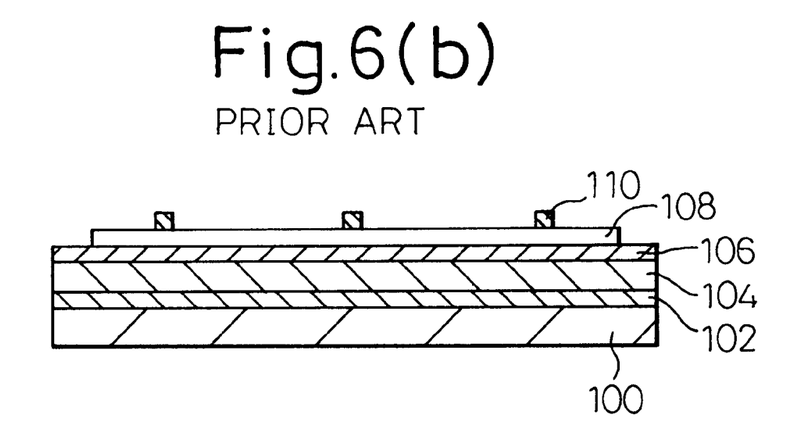

FIGS. 6(a) and 6(b) show a compound semiconductor solar cell having a p-n junction light absorbing layer according to the prior art. FIG. 6(a) is a front view of the solar cell of compound semiconductor and FIG. 6(b) is a longitudinal sectional view. This compound semiconductor solar cell (hereinafter called merely the "solar cell" in some cases) includes a molybdenum layer 102 on a glass substrate 100. A p-type semiconductor layer 104 and an n-type semiconductor layer 106 are formed serially on this molybdenum layer 102. A transparent electrode 108 is formed on the n-type semiconductor layer 106. A comb-shaped electrode 110 is formed on the transparent electrode 108. In this comb-shaped electrode 110, an electrode is formed in a branched shape (a comb shaped) as shown in FIG. 6(a).

The solar cell shown in FIGS. 6(a) and 6(b) can be produced by the method that is shown in FIGS. 7(a) to 7(d). First, an electrode film comprising the molybdenum layer 102 is formed on one of the surfaces of the glass substrate 100 by evaporation or sputtering. Next, an indium layer 103 is evaporated at room temperature. A copper layer 105 is further evaporated on the indium layer 103 at room temperature (process step shown in FIG. 7(a)).

Figure 7A:
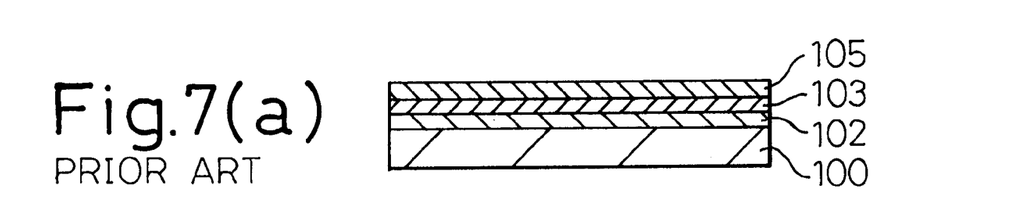
FIGS. 7(a) to 7(d) are schematic sectional views useful for explaining a production method of the compound semiconductor solar cell according to the prior art shown in FIGS. 6(a) and 6(b).
Figure 7B:
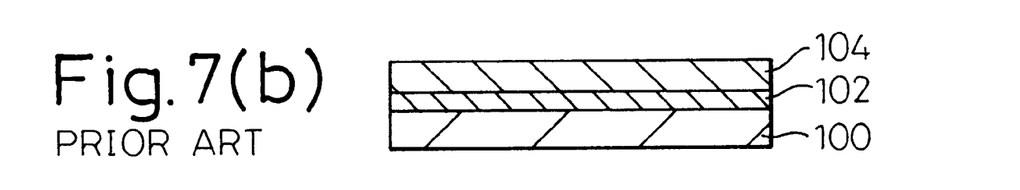

The metallic film comprising the indium layer 103 and the copper layer 105 are heat-treated in a hydrogen sulfide atmosphere, for sulfurization treatment, to convert the metallic film to a p-type semiconductor layer 104 of $CuInS_2$. A KCN treatment for etching the surface of this p-type semiconductor layer 104 with a KCN solution containing 5 to 10% by weight of KCN is conducted. In this way, impurities formed in the p-type semiconductor layer 104, such as $Cu_xS_y$ (sulfide), are removed and the characteristics of the p-type semiconductor layer 104 are optimized and stabilized (step shown in FIG. (b)).

Figure 7C:
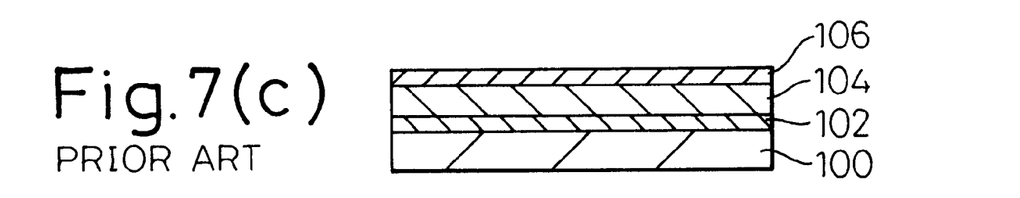
Figure 7D:
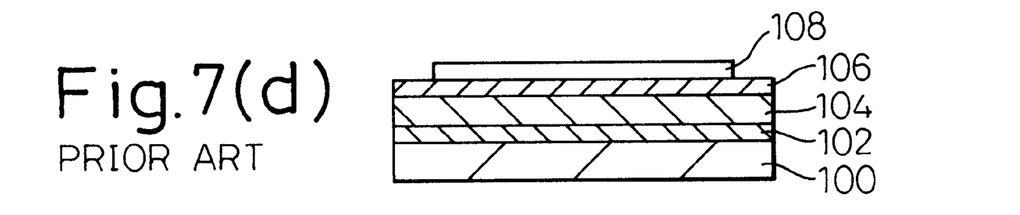

An n-type semiconductor layer 106 is further formed on the p-type semiconductor layer 104 by a chemical bath deposition method (step shown in FIG. 7(c)). A transparent electrode 108 made of Al or $In_2O_3$ is formed on the n-type semiconductor layer 106 by sputtering (step shown in FIG. 7(d).

A comb-shaped electrode 110 made of aluminum is formed on the transparent electrode 108. Furthermore electrode terminals (not shown) are formed on the molybdenum layer 102 in the solar cell shown in FIGS. 6(a) and 6(b).

In the solar cell shown in FIGS. 6(a) and 6(b), crystallinity inside the p-type semiconductor layer 104 can be improved by increasing as much as possible the Cu/In atomic ratio of copper (Cu) to indium (In) forming the p-type semiconductor layer 104 before the KCN treatment (the term "Cu/In atomic ratio" will hereinafter mean the Cu/In atomic ratio of copper (Cu) to indium (In) forming the p-type semiconductor layer 104 before the KCN treatment) and/or by maximizing the thickness of the p-type semiconductor layer 104. As a result, power generation efficiency of the solar cell can be improved.

In existing solar cells of this kind, however, the Cu/In atomic ratio of the p-type semiconductor layer 104 before the KCN treatment is at most about 1.6, from the aspect of the production yield of the solar cells finally obtained, because, if the Cu/In atomic ratio is increased beyond 1.6, the p-type semiconductor layer 104 becomes more likely to peel from the electrode film 102 during the KCN treatment.

The upper limit of the P-type semiconductor layer 104 is also about 2 $\mu$m. When the thickness of the metallic film comprising the indium layer 103 and the copper layer 105 is increased so as to form a p-type semiconductor layer 104 which is more than 2 $\mu$m thick, peeling of the p-type semiconductor layer 104 occurs during the KCN treatment.

For these reasons, in the production methods according to the prior art it has been extremely difficult to improve power generation efficiency of the solar cell by improving crystallinity inside the p-type semiconductor layer 104.

In a compound semiconductor solar cell including a p-type semiconductor layer formed mainly of copper (Cu) and indium (In), with gallium (Ga) whenever necessary, and having a p-n junction, it is therefore a main object of the present invention to provide a compound semiconductor solar cell that has a higher Cu/In atomic ratio of copper (Cu) to indium (In) before a KCN treatment than that of the prior art cells, and that has improved crystallinity inside the p-type semiconductor layer, and to provide a production method for such a solar cell.

SUMMARY OF THE INVENTION

The inventors of the present invention have conducted studies to search for the method of solving these problems, and have acquired the following information. If an indium layer is formed under heating at a step of laminating the indium layer and a copper layer on an electrode film formed on one of the surfaces of a substrate to form a metallic film, peeling of a p-type semiconductor layer can be suppressed to maximum during KCN treatment even when the thickness of the metallic film comprising the indium layer and the copper layer is increased so that a Cu/In atomic ratio of the p-type semiconductor layer becomes at least 1.8 and the thickness of the p-type semiconductor layer obtained finally becomes at least 2 $\mu$m. The present invention is completed on the basis of this observation.

In a method of producing a compound semiconductor solar cell by the steps of laminating an indium layer and a copper layer on an electrode film formed on one of the surfaces of a substrate to form a metallic film, subjecting the metallic film to sulfurization treatment or selenization treatment to form a p-type semiconductor layer made of $CuInS_2$ or $CuInSe_2$, then subjecting the p-type semiconductor layer to KCN treatment, for removing impurities such as copper sulfide, copper selenide, etc., with a KCN solution, and forming an n-type semiconductor layer on the p-type semiconductor layer; the present invention is characterized in that the indium layer is formed under heating, or the formed indium layer is heat-treated while its surface is exposed.

In a method of producing a compound semiconductor solar cell by the steps of laminating a gallium layer or a gallium-copper alloy layer, an indium layer and a copper layer on an electrode film formed on one of the surfaces of a substrate to form a metallic film; subjecting the metallic film to sulfurization treatment or selenization treatment to form a p-type semiconductor layer made of $Cu(In, Ga)S_2$ or $Cu(In, Ga)Se_2$ then subjecting the p-type semiconductor layer to KCN treatment, for removing impurities such as copper sulfide, copper selenide, etc., with a KCN solution, and forming an n-type semiconductor layer on the p-type semiconductor layer; the present invention is characterized in that the indium layer is formed under heating, or the formed indium layer is heat-treated while its surface is exposed.

Here, the reason why Cu(In, Ga)S$_2$ or Cu(In, Ga)Se$_2$ is used is because the energy band gap of these compounds can be optimized and device performance can be improved when they contain Ga.

The gallium layer is formed on the electrode film of Mo, or the like, by sputtering or evaporation. A gallium-copper alloy layer can be used in place of the gallium layer. Gallium also plays the role of improving adhesion between the p-type semiconductor layer and the electrode film.

In the present invention, the copper layer may be heated during its formation process in the same way as the indium layer.

In the present invention having the construction described above, the heating temperature when the indium layer is formed by heating or the heating temperature when the indium layer is heat-treated by a heat-treatment is such that the substrate can be heated to 120 to 220° C. In this way, peeling of the p-type semiconductor layer during the KCN treatment can be prevented more effectively.

Performance of the solar cell finally obtained can be improved if the metallic film formed by laminating the indium layer and the copper layer, or the gallium layer or the gallium-copper alloy layer, the indium layer and the copper layer, is constituted in such a fashion the Cu/In atomic ratio of copper (Cu) to indium (In), that together form the p-type semiconductor layer, is at least 1.8 before the KCN treatment.

The p-type semiconductor layer is formed so that the thickness before the KCN treatment is greater than the thickness of the p-type semiconductor layer formed finally. The resulting p-type semiconductor layer is etched by chemical etching to a predetermined thickness after the KCN treatment. In this way, the thickness of the p-type semiconductor layer finally formed can be controlled easily even by plating by which film control is more difficult than evaporation and sputtering.

Even if any local variance exists in layer quality of the p-type semiconductor layer, this variance can be corrected by KCN treatment and chemical etching and layer quality can be optimized. Therefore, the present invention can more easily produce a solar cell having a higher quality.

Particularly when the metallic film, that is formed by laminating the indium layer and the copper layer, or the gallium layer or the gallium-copper alloy layer, the indium layer and the copper layer, is formed so that the thickness of the p-type semiconductor layer after the KCN treatment or chemical etching is 2 to 10 μm, performance of the solar cell finally obtained can be improved.

The production method of the compound semiconductor solar cell according to the prior art controls the thickness of the metallic film comprising the indium layer and the copper layer so that the Cu/In atomic ratio of the p-type semiconductor layer is not greater than 1.6 and the film thickness of the p-type semiconductor layer obtained finally is not greater than 2 μm in order to prevent peeling of the p-type semiconductor layer during the KCN treatment. Therefore, the crystal grain size of the p-type semiconductor layer obtained finally is small and hence, power generation efficiency of the solar cell is low, too.

On the other hand, the production method of the present invention forms the indium layer under heating or subjects the indium layer to heat-treatment while its surface is exposed. Therefore, even when the thickness of the metallic film comprising the indium layer and the copper layer is adjusted so that the Cu/In atomic ratio of the p-type semiconductor layer becomes at least 1.8, peeling of the p-type semiconductor layer during the KCN treatment can be prevented. In other words, the production method of the present invention can form the p-type semiconductor layer comprising the indium layer and the copper layer to a greater thickness than the prior art devices so that the Cu/In atomic ratio can be made higher and the thickness of the p-type semiconductor layer obtained finally can be made greater than those of the prior art devices. In consequence, the compound semiconductor solar cell having the p-n junction according to the production method of the present invention has higher power generation efficiency than that of the compound semiconductor solar cell according to the prior art.

As a result of intensive studies to search for the method of solving the problems described above, the present inventors have found that at least a 1.8 Cu/In atomic ratio, of the p-type semiconductor layer before the KCN treatment, can be achieved by interposing a thin metal layer made of a precious metal such as gold, a platinum group element such as platinum (Pt) and palladium (Pd), etc., between the electrode film formed on one of the surfaces of the substrate and the p-type semiconductor layer. The present invention is completed on the basis of this finding, too.

The precious metal is suitably gold (Au), platinum (Pt) or palladium (Pd), and two or more of them may be used as an alloy.

In the present invention, the thickness of the thin metal layer is at least 2 nm, preferably 5 to 200 nm, more preferably 5 to 100 nm and most preferably 5 to 20 nm, to reduce the production cost of the compound semiconductor solar cell.

Power generation efficiency can be made higher than that of the conventional solar cells when the electrode film comprises a molybdenum (Mo) film formed on one of the surfaces of the glass film and the p-type semiconductor layer comprises CuInS$_2$ or CuInSe$_2$, or Cu(In, Ga)S$_2$ or Cu(In, Ga)Se$_2$.

Another feature of the present invention resides in the following point. In a production method of a compound semiconductor solar cell by the steps of laminating an indium layer and a copper layer on an electrode film formed on one of the surfaces of a substrate to form a metallic film, subjecting the metallic film to sulfurization treatment or selenization treatment to form a p-type semiconductor layer made of CuInS$_2$ or CuInSe$_2$, subjecting the p-type semiconductor layer to KCN treatment for removing impurities such as copper sulfide and copper selenide, etc., by a KCN solution, and forming an n-type semiconductor layer; the present invention is characterized in that a thin film metal layer made of a precious metal such as gold (Au) or a platinum group metal such as platinum (Pt), palladium (Pd), etc., which has a thickness smaller than the thickness of the p-type semiconductor layer, is formed on the surface of the electrode film, and then a metallic film comprising an indium layer and a copper layer is formed on the surface of the thin film metal layer.

In a production method of a compound semiconductor solar cell by the steps of laminating a gallium layer or a gallium-copper alloy layer, an indium layer and a copper layer on an electrode film formed on one of the surfaces of a substrate to form a metallic film, subjecting the metallic film to sulfurization treatment or selenization treatment to form a p-type semiconductor layer made of Cu(In, Ga)S$_2$ or Cu(In, Ga)Se$_2$, subjecting the p-type semiconductor layer to KCN treatment for removing impurities such as copper sulfide and copper selenide, etc., by a KCN solution, and forming an n-type semiconductor layer; the present invention is characterized in that a thin metal layer made of a precious metal such as gold (Au) or a platinum group metal such as platinum (Pt), palladium (Pd), etc., which has a thickness smaller than the thickness of the p-type semiconductor layer, is formed on the surface of the electrode film, and then a metallic film comprising a gallium layer or a gallium-copper alloy layer, an indium layer and a copper layer is formed on the surface of the thin film metal layer.

In the present invention described above, the metallic film comprising the indium layer and the copper layer, or comprising the gallium layer or the gallium-copper alloy layer, the indium layer and the copper layer, is formed so that the Cu/In atomic ratio of copper (Cu) to indium (In) forming the p-type semiconductor layer before the KCN treatment becomes at least 1.8. In this way, performance of the solar cell finally obtained can be improved.

In the present invention, even when the Cu/In atomic ratio of the p-type semiconductor layer is 1.8 or more, peeling of the p-type semiconductor layer from the electrode film during the KCN treatment can be prevented. Therefore, the Cu/In atomic ratio of the p-type semiconductor layer can be increased to a ratio higher than that of the conventional compound semiconductor solar cells, and crystallinity inside the p-type semiconductor layer can be improved. As a result, power generation efficiency of the compound semiconductor solar cell having the p-n junction according to the present invention is higher than power generation of the conventional compound semiconductor solar cells.

DESCRIPTION OF THE PREFERRED EMBODIMENTS

FIGS. 1(a) to 1(f) shows an example of a production method for producing a compound semiconductor solar cell according to one embodiment of the present invention. First, an electrode film comprising a molybdenum layer 12 is formed by evaporation or sputtering on one of the surfaces of a glass substrate 10 (step shown in FIG. 1(a)). While the glass substrate 10 is heated by a heater (not shown), an indium layer 13 is formed by evaporation (step in FIG. 1(b)). Heating by the heater is conducted in vacuum so that the temperature of the glass substrate 10, that is measured by a temperature sensor such as a thermocouple fitted to the glass substrate 10, reaches 120 to 220° C. (preferably, 140 to 190° C.).

Figure 1A:
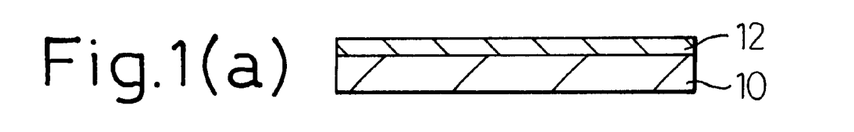
FIGS. 1(a) to 1(f) are schematic sectional views useful for explaining a production method of a compound semiconductor solar cell according to one embodiment of the present invention.
Figure 1B:
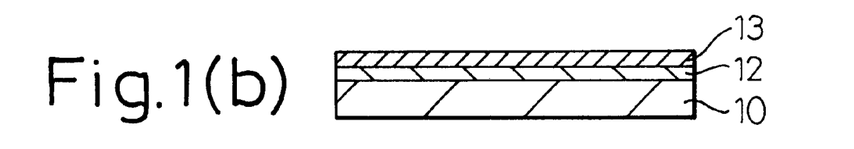

After the indium layer 13 is formed by evaporation or plating at room temperature, this heating may also be carried out under the condition where the surface of the indium layer 13 is exposed. Heating may also be carried out in a non-oxidizing gas atmosphere such as in a nitrogen gas.

As described above, the indium layer 13 is heat-treated after it is formed under heating or while the surface of the indium layer 13 so formed is exposed. Next, a copper layer 15 is formed by evaporation or plating on the indium layer 13 (step in FIG. 1(c)). The copper layer 15 may be formed by evaporation while the glass substrate 10 is heated by a heater, or by evaporation or plating at room temperature.

Figure 1C:
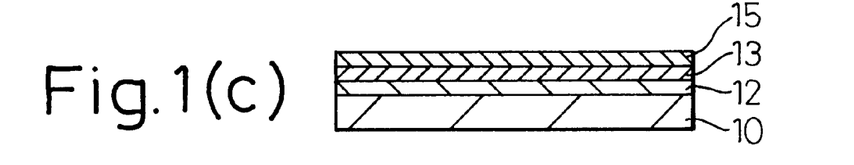

However, even when heat-treatment is conducted after the copper layer 15 is formed on the indium layer 13 that is formed by evaporation at room temperature, it is extremely difficult to secure the Cu/In atomic ratio of the p-type semiconductor layer 14 of at least 1.8.

In the process steps shown in FIGS. 1(b) and 1(c), the copper layer 15 is formed on the indium layer 13 after this indium layer 13 is formed. However, it is also possible to form the copper layer 15 on the electrode film 15 at room temperature and then to form the indium layer 13 on the copper layer 15 while the glass substrate 10 is being heated. Alternatively, it is further possible to form the indium layer 13 on the copper layer 15 at room temperature and then to apply heat-treatment to the indium layer 13 while the surface of the indium layer is kept exposed.

Sulfurization treatment for heat-treating the metallic film comprising the indium layer 13 and the copper layer 15 in a hydrogen sulfide atmosphere is conducted so as to convert this metal layer to a p-type semiconductor layer 14 of CuInS$_2$. This sulfurization treatment can be conducted by causing an inert gas such as an argon gas that contains 5 vol % of hydrogen sulfide (H$_2$S) to flow in an atmosphere at 540° C. for about 2 hours.

Figure 1D:
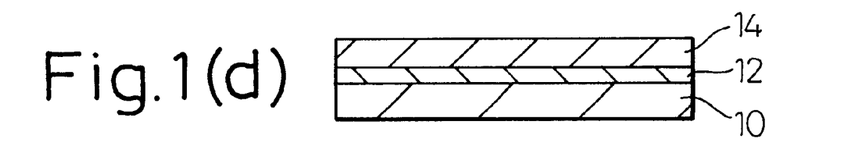

The surface of the p-type semiconductor layer 14 thus obtained is etched with a KCN solution containing 5 to 10 wt % of KCN. This KCN treatment is directed to remove impurities formed in the p-type semiconductor layer 14 such as Cu$_x$S$_y$, and to optimize and stabilize the characteristics of the p-type semiconductor layer 14 (step in FIG. 1(d)). In this KCN treatment, washing of the p-type semiconductor layer 14 can be conducted by immersing the p-type semiconductor layer 14 in the KCN solution for 1 to 5 minutes.

Because the indium layer 13 is formed under heating (step in FIG. 1(b)), peeling of the p-type semiconductor layer 14 does not occur during the KCN treatment even when the Cu/In ratio of the p-type semiconductor layer 14 formed by the sulfurization treatment reaches 1.8 or more.

When the indium layer 103 is formed without heat-treatment as in the conventional production process shown in FIGS. 7(a) to 7(d), on the other hand, the p-type semiconductor layer 14 peels from the molybdenum layer 12 during the KCN treatment if the Cu/In atomic ratio of the p-type semiconductor layer immediately before the KCN treatment is 1.6 or more in the p-type semiconductor layer 104 formed by the sulfurization treatment.

Figure 1E:
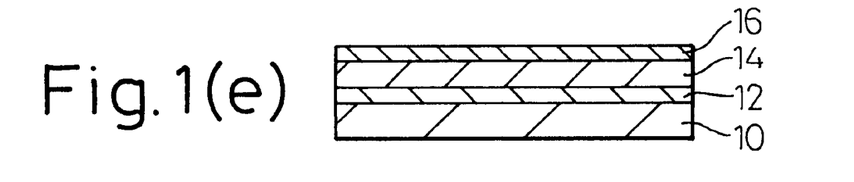

An n-type semiconductor layer 16 is formed on the resulting p-type semiconductor layer 14 by a chemical bath deposition method (step in FIG. 1(e)). This n-type semiconductor layer 16 can be formed by immersing the glass substrate 10 having the p-type semiconductor layer 14 formed thereon into a mixed solution of $ZnSO_4$ (0.1 mol/l), thiourea (0.6 mol/l) and aqueous $NH_3$ solution (3 mol/l) at 80° C.

The process step described above relates to the case where the n-type semiconductor layer 14 is ZnS. When the n-type semiconductor layer 14 is CdS, the glass substrate is immersed in a mixed solution of cadmium iodide (0.0015 mol/l), an aqueous $NH_3$ solution (1.0 mol/l) and ammonium iodide (0.01 mol/l). When the temperature reaches about 40° C. by heating, thiourea (0.15 mol/l) is added, and the glass substrate is kept immersed at 80° C. for 5 minutes.

Figure 1F:
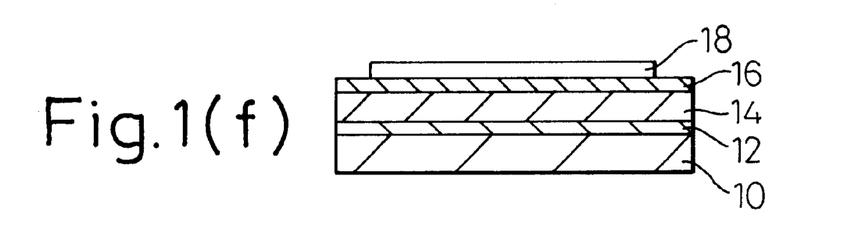

A transparent electrode 18 made of ZnO doped with Al is formed on the n-type semiconductor layer 16 (step in FIG. 1(f)).

Thereafter, a comb-shaped electrode 110 made of aluminum is formed on the transparent electrode 18, to give the solar cell.

According to the method shown in FIGS. 1(a) to 1(f), peeling of the p-type semiconductor layer 14 during the KCN treatment can be prevented even when the Cu/In atomic ratio of the p-type semiconductor layer 14 is 1.8 or more. Also, crystallinity inside the p-type semiconductor layer 14 can be improved. Since the production process is substantially the same as the production process of the prior art shown in FIG. 5, a solar cell having high performance can be produced economically.

In the production method shown in FIGS. 1(a) to 1(f), the film thickness of the metallic film comprising the indium layer 13 and the copper layer 15 is preferably adjusted so that the thickness of the p-type semiconductor layer 14 obtained finally becomes 2 to 10 $\mu$m. If the thickness of the p-type semiconductor layer 14 is less than 2 $\mu$m, crystallinity inside the p-type semiconductor layer 14 is likely to drop and if it exceeds 10 $\mu$m, on the other hand, the internal resistance of the p-type semiconductor layer 14 is likely to increase.

Figure 2A:
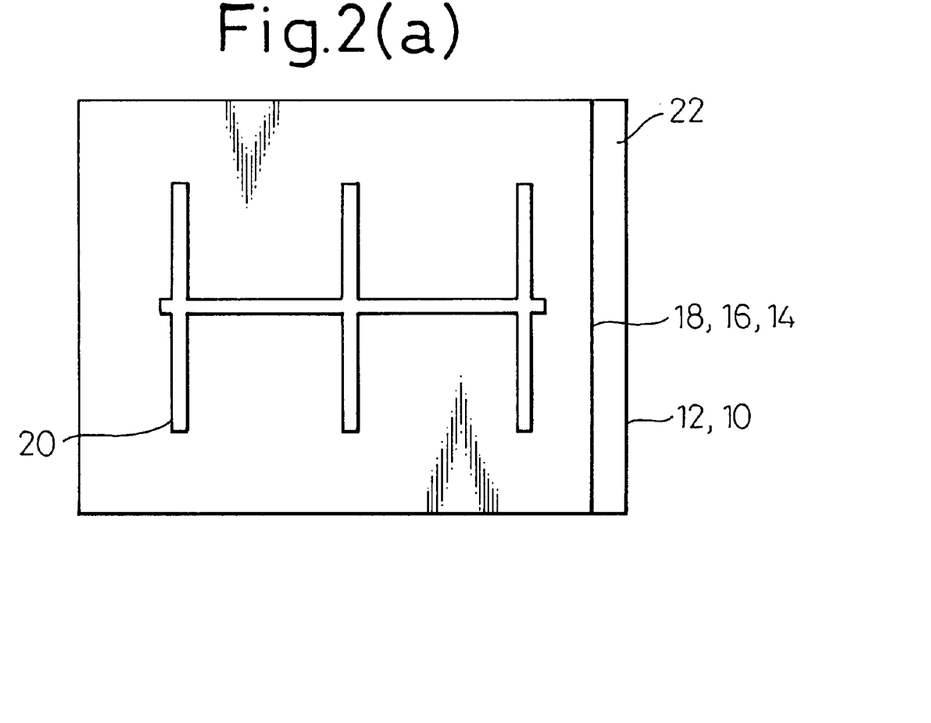
FIGS. 2(a) and 2(b) are a front view (a) and a perspective view (b) of the compound semiconductor solar cell produced by the production method shown in FIGS. 1(a) to 1(f)
Figure 2B:
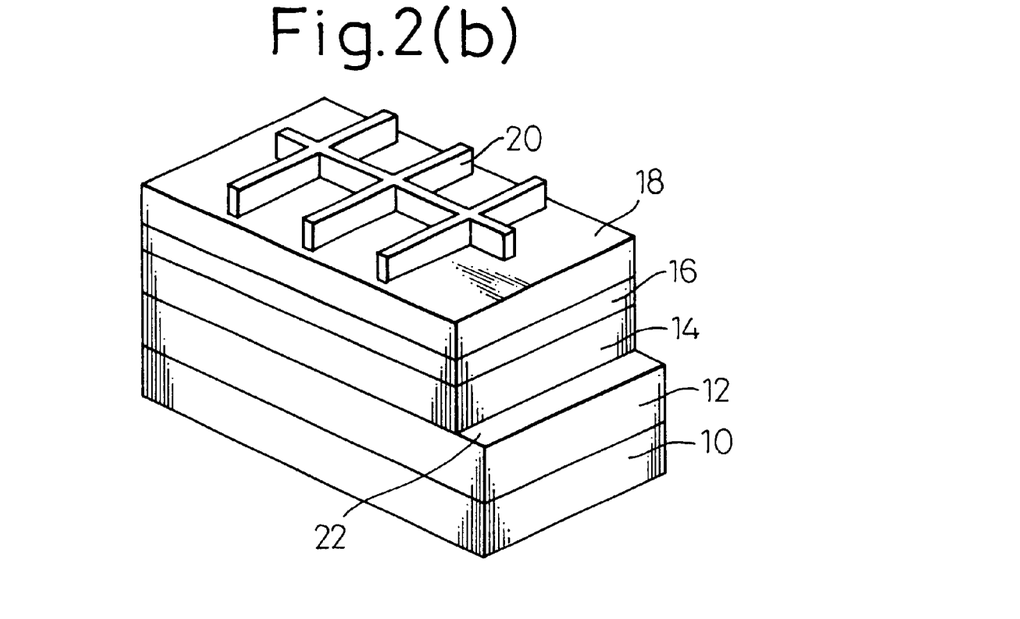

FIGS. 2(a) and (b) show the solar cell produced by the production method shown in FIGS. 1(a) to 1(f). FIG. 2(a) is a front view of the solar cell and FIG. 2(b) is its perspective view. In the solar cell shown in FIGS. 2(a) and 2(b), the molybdenum layer 12 is formed as the electrode film on the glass substrate 10. The p-type semiconductor layer 14 of $CuInS_2$ and the n-type semiconductor layer 16 are laminated in this order on the molybdenum layer 12. The transparent electrode 18 is formed on the n-type semiconductor layer 16. Furthermore, the comb-shaped electrode 20 is formed on the transparent electrode 20. In this comb-shaped electrode 20, the electrode is shaped into a branch shape (comb-shape), as shown in FIG. 2(a).

In the solar cell shown in FIGS. 2(a) and 2(b), an electrode terminal 22 that forms a pair with the comb-shaped electrode 20 is formed on the exposed surface of the molybdenum layer 12. The portion of the electrode terminal 22, that forms the electrode terminal on the molybdenum layer 12, is covered in advance with a resist or mask for protection. The resist or the mask for protection is removed after the p-type semiconductor layer 14, the n-type semiconductor layer 16 and the transparent electrode 18 are formed.

In the production method shown in FIGS. 1(a) to 1(f), both indium layer 13 and copper layer 15 are formed by evaporation. However, either one, or both, of them can be formed by plating.

When the indium layer 13 is constituted by plating, however, this indium layer 13 cannot be formed while it is being heated, as in the case of evaporation or sputtering. Therefore, the indium layer 13 is first formed and, while its surface is exposed, the indium layer 13 is heated to 120 to 220° C. (particularly preferably, 140 to 190° C.).

When the indium layer 13 and/or the copper layer 15 is formed by plating, it is more difficult to control the layer thickness than in the formation of the indium layer 13 and the copper layer 15 by evaporation and sputtering. Therefore, the p-type semiconductor layer 14 before the KCN treatment is formed to a thickness greater than the thickness of the final p-type semiconductor layer 14, and chemical etching is conducted after the KCN treatment to obtain the p-type semiconductor layer 14 having a predetermined thickness. One or a plurality of compounds selected from the group consisting of hydrogen peroxide, sulfuric acid, ammonium hydroxide, ammonium persulfate, sodium persulfate, copper sulfate, ammonia, phosphoric acid and hydrochloric acid can be used for this chemical etching. Particularly preferred among them is hydrogen peroxide.

As described above, the indium layer 13 and/or the copper layer 15 is formed by plating so that the p-type semiconductor layer 14 before the KCN treatment becomes thicker than the p-type semiconductor layer 14 formed finally. This method can not only easily control the layer thickness of the p-type semiconductor layer 14 but can promote the growth of the $CuInS_2$ crystal forming the p-type semiconductor layer 14 and can maximize the crystal grain size. In consequence, the power generation efficiency of the solar cell finally obtained can be improved.

Incidentally, when the metallic film comprising the indium layer 13 and the copper layer 15 is formed by evaporation or sputtering, too, the film thickness of the metallic film may be adjusted so that the p-type semiconductor layer 14 finally formed is 2 to 10 $\mu$m (preferably 3 to 6 $\mu$m) in order to increase the crystal grain size to maximum.

In the explanation given above, the metallic film comprises the indium layer 13 and the copper layer 15. However, this metallic film may comprise a gallium layer or a copper-gallium alloy layer, the indium layer 13 and the copper layer 15.

Selenization treatment for heating the metallic film comprising the indium layer 13 and the copper layer 15 and formed on the glass substrate 10 in a hydrogen selenide atmosphere may be employed, too, when the metallic film comprises the p-type semiconductor layer. In this case, a p-type semiconductor layer of $CuInSe_2$ is formed.

Besides evaporation, sputtering and plating may be employed for forming the indium layer 13 and the copper layer 15. Evaporation, sputtering and plating may further be used in combination.

Figure 3A:
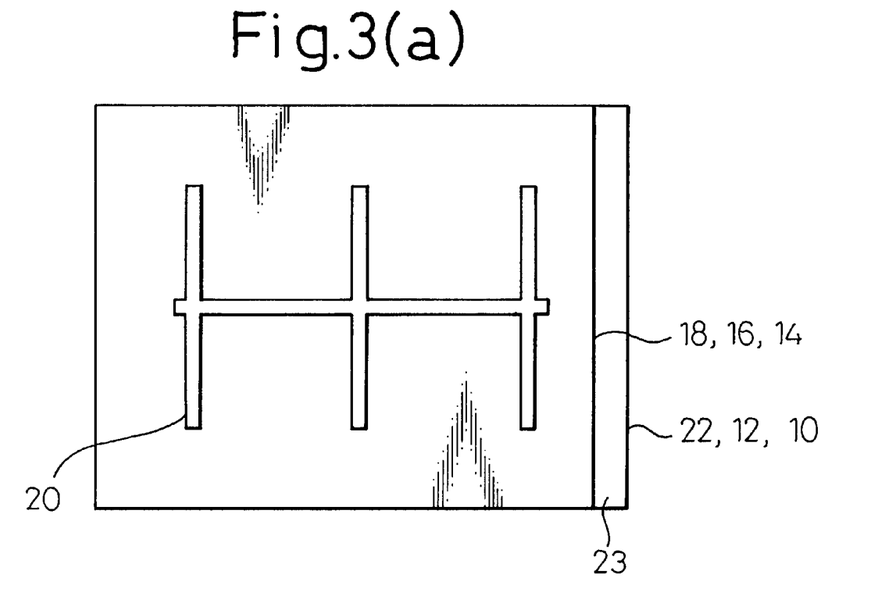
FIGS. 3(a) and 3(b) are front view (a) and a perspective view (b) useful for explaining a compound semiconductor solar cell according to one embodiment of the present invention.
Figure 3B:
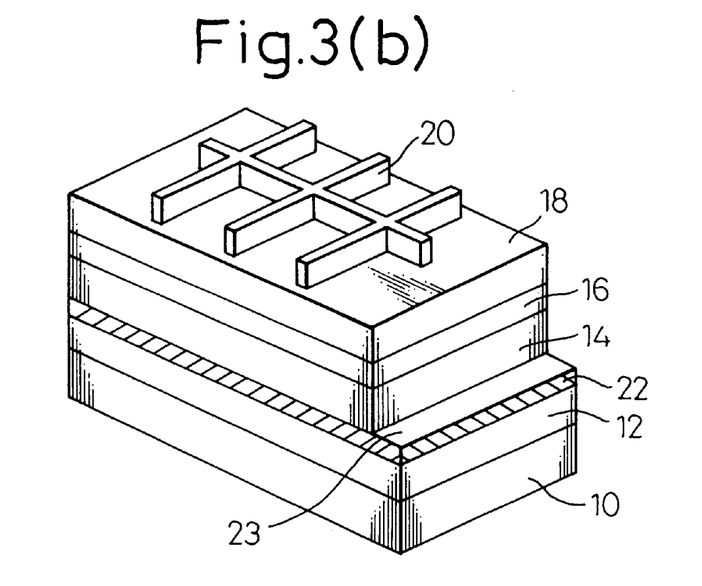

Next, FIGS. 3(a) and 3(b) show an example of the compound semiconductor solar cell according to the present invention. FIG. 3(a) is a front view of the solar cell and FIG. 3(b) is its perspective view. The solar cell shown in FIGS. 3(a) and 3(b) includes a molybdenum layer 12 as an electrode film on a glass substrate 10. A p-type semiconductor layer 14 of $CuInS_2$ and an n-type semiconductor layer 16 are serially laminated on this molybdenum layer 12. A transparent electrode 18 is further laminated on the n-type semiconductor layer 16. A comb-shaped electrode 20 is formed on the transparent electrode 18. The electrode of this comb-shaped electrode 20 is branched (comb-shaped) as shown in FIG. 3(a).

In this solar cell, a thin film metal layer 22 made of gold (Au), platinum (Pt) or palladium (Pd) is interposed between the molybdenum layer 12 and the p-type semiconductor layer 14. As shown in FIG. 3(b), this thin film metal layer 22 is thinner than all the other layers and films that constitute the solar cell. Its thickness is sufficiently 5 nm. From the practical aspect, however, the thickness of the thin film metal layer 22 is preferably within the range of 2 to 200 nm and particularly preferably, from 5 to 20 nm.

In the p-type semiconductor layer 14, the Cu/In atomic ratio can be increased to 1.8 or more before the later-appearing KCN treatment. In the compound semiconductor solar cell of the prior art in which the p-type semiconductor layer 14 is formed directly on the molybdenum layer 12, the p-type semiconductor layer is likely to peel from the molybdenum layer 12 during the KCN treatment if the Cu/In atomic ratio of the p-type semiconductor layer before the KCN treatment is greater than 1.6.

The solar cell shown in FIGS. 3(a) and 3(b) can be produced by the production method shown in FIGS. 4(a) to 4(f). First, the molybdenum layer 12 as the electrode film is formed by sputtering on one of the surface sides of the glass substrate 10 (step shown in FIG. 4(a)). A thin film metal layer 22 made of gold (Au), platinum (Pt) or palladium (Pd) and having a thickness of 5 to 100 nm is then formed on the molybdenum layer 12 by evaporation, sputtering or electrolytic plating (step in FIG. 4(b)).

The indium layer 13 is formed on the thin film metal layer 22 by evaporation at room temperature. The copper layer 15 is formed on this indium layer 13 by evaporation at room temperature (step in FIG. 4(c)). In this instance, the thickness of each of the indium layer 13 and the copper layer 15 is controlled so that the Cu/In atomic ratio of the p-type semiconductor layer before the KCN treatment becomes at least 1.8.

Figure 4A:
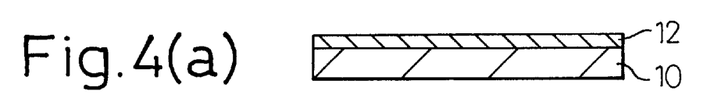
FIGS. 4(a) to 4(f) are schematic sectional views useful for explaining a production method of the compound semiconductor solar cell shown in FIGS. 3(a) and 3(b)
Figure 4B:
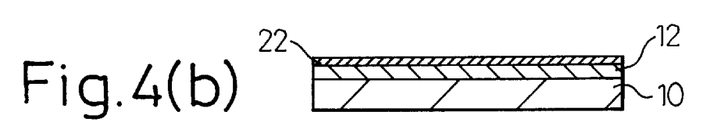
Figure 4C:
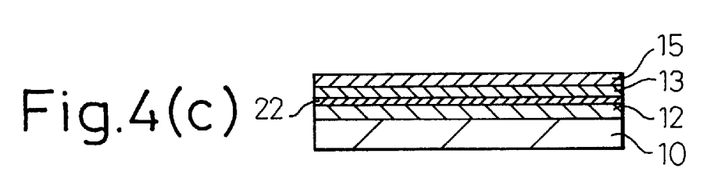
Figure 4D:
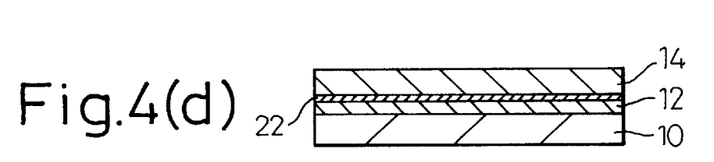

Next, the metal film comprising the indium layer 13 and the copper layer 15 is subjected to sulfurization heat-treatment that heats the metal film in a hydrogen sulfide atmosphere (step in FIG. 4(d)). This sulfurization treatment can be carried out by causing an inert gas containing 5 vol % of hydrogen sulfide ($H_2S$), such as an argon gas, to flow at a temperature of 540° C. for about 2 hours.

Impurities formed in the p-type semiconductor layer 14 such as $Cu_xS_y$, are removed so as to provide a solar cell having an optimum p-n junction. Furthermore, to optimize and stabilize the characteristics of the p-type semiconductor layer 104, a KCN treatment, that etches the surface of the p-type semiconductor layer 104 with a KCN solution containing 5 to 10 wt % of KCN, is conducted. This KCN treatment can be carried out by immersing the surface of the p-type semiconductor layer 14 in a solution containing 5 to 10 wt % of KCN at room temperature for 1 to 5 minutes.

As a result of such a KCN treatment, the p-type semiconductor layer formed on the thin film metal layer 22 does not peel from the molybdenum layer 12 even when the Cu/In atomic ratio of the p-type semiconductor layer immediately before the KCN treatment is greater than 1.8.

In the solar cell according to the prior art shown in FIGS. 6(a) and 6(b) in which the p-type semiconductor layer 104 is formed directly on the molybdenum layer 102, the p-type semiconductor layer 104 peels from the molybdenum layer 102 when the Cu/In atomic ratio of the p-type semiconductor layer immediately before the KCN treatment exceeds 1.6.

Figure 4E:
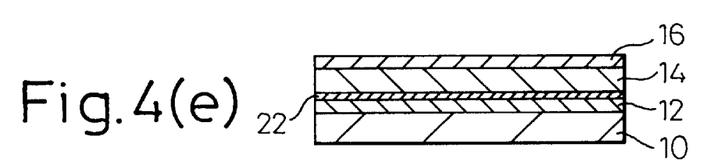

The n-type semiconductor layer 16 is formed next on the p-type semiconductor layer 14 by the chemical bath deposition method (step in FIG. 4(e)). The n-type semiconductor layer 16 can be formed by immersing the glass substrate 10 having the p-type semiconductor layer 14 formed thereon into a mixed solution of $ZnSO_4$ (0.1 mol/l), thiourea (0.6 mol/l) and an aqueous $NH_3$ solution (3 mol/l) at 80° C., for about 10 minutes.

This process step is conducted when the n-type semiconductor layer 16 is ZnS. When the n-type semiconductor layer 16 is CdS, the glass substrate is immersed into a mixed solution of cadmium iodide (0.0015 mol/l), an aqueous $NH_3$ solution (1.0 mol/l) and ammonium iodide (0.01 mol/l). When the temperature reaches about 40° C. with heating, thiourea (0.15 mol/l) is added, and the substrate is immersed at 80° C. for 5 minutes.

Figure 4F:
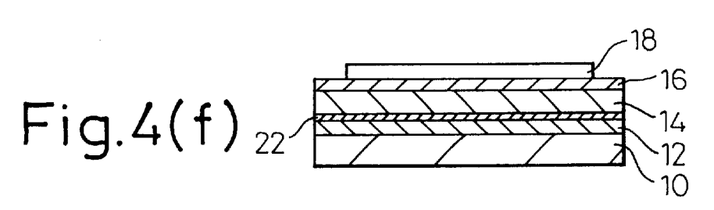

A transparent electrode 18 made of ZnO doped with Al is formed on the n-type semiconductor layer 16 (step in FIG. 4(f)).

Thereafter, the comb-shaped electrode 20 is formed from aluminum on the transparent electrode 18, and the electrode terminal 23 is formed on the molybdenum layer 12. In consequence, the solar cell shown in FIGS. 3(a) and 3(b) can be acquired.

This electrode terminal 23 can be formed in the following way. The portion on the molybdenum layer 12, at which the electrode terminal 23 is to be formed is covered in advance with a resist or mask for protection. After the p-type semiconductor layer 14, the n-type semiconductor layer 16 and the transparent electrode 18 are formed, the resist or the mask for protection is removed.

In the explanation given above, the metallic film comprises the indium layer 13 and the copper layer 15. However, the metallic film may be formed of the gallium layer or a copper-gallium alloy layer, the indium layer 13 and the copper layer 15.

When the metallic film is converted to the p-type semiconductor layer, sulfurization treatment, that heats the metallic film comprising the indium layer 13 and the copper layer 15 formed on the glass substrate 10 in a hydrogen sulfide atmosphere, can be employed, too. In this case, a p-type semiconductor layer 14 of $CuInSe_2$ is formed.

Besides evaporation, sputtering or plating can be employed for forming the indium layer 13 and the copper layer 15. Evaporation, sputtering and plating may be used in combination.

EXAMPLE 1

Figure 5:
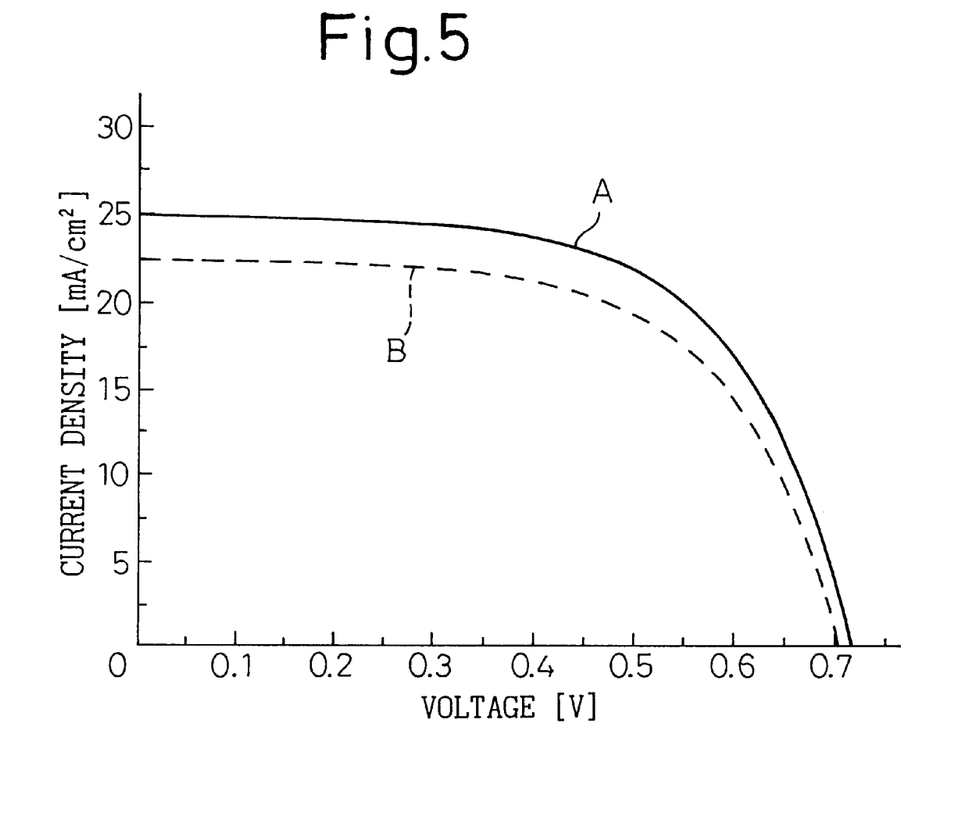
FIG. 5 is a graph showing I–V characteristics of the solar cell produced by the production method shown in FIGS. 1(a) to 1(f) and of the solar cell shown in FIGS. 3(a) and 3(b)

A curve A in FIG. 5 shows the I–V characteristics of the solar cell shown in FIGS. 2(a) and 2(b) and of the solar cell shown in FIGS. 3(a) and 3(b). The curve A represents the measurement results at AM 1.5 (100 mW/cm$^2$). (Since two curves are very close to one another, they are shown by one curve A.)

The solar cell shown in FIGS. 2(a) and 2(b) was a solar cell having a light reception area (effective area) of 0.25 cm$^2$, and was produced in the following way.

First, a metallic film comprising a 2,000 nm-thick indium layer 13 and a 2,600 nm-thick copper layer 15, that were heated by evaporation, was formed on an about 1 μm-thick molybdenum layer 12 formed on one of the surfaces of a glass substrate 10. This metallic film was subjected to sulfurization treatment to form a p-type semiconductor layer 14 made of $CuInS_2$. This p-type semiconductor layer 14 was about 8 μm-thick, and the Cu/In atomic ratio was 3.0. Next, the p-type semiconductor layer 14 was subjected to KCN treatment and was further subjected to chemical etching to reduce the thickness of the p-type semiconductor layer 14 to about 4 $\mu$m. Thereafter, an n-type semiconductor layer 16 made of ZnS having a thickness of 80 to 120 nm was formed on the p-type semiconductor layer 14. Furthermore, an about 1 $\mu$m-thick transparent electrode 18 made of ZnO doped with Al was formed.

The production method was the same when CdS or InS was used for the n-type semiconductor layer 16.

The solar cell shown in FIGS. 3(a) and 3(b) had similarly a light reception area (effective area) of 0.25 cm$^2$. The solar cell comprised an about 1 $\mu$m-thick molybdenum layer 12 formed on a glass substrate 10, a 5 nm-thick thin film metal layer 22 of platinum (Pt), an about 2.5 $\mu$m-thick p-type semiconductor layer 14 made of CuInS$_2$ having a Cu/In atomic ratio of 3.0 immediately before the KCN treatment, an 80 to 120 nm-thick n-type semiconductor layer 16 of ZnS and an about 1 $\mu$m-thick transparent electrode 18 made of ZnO doped with Al.

The construction was the same when CdS or InS was used for the n-type semiconductor layer 16.

On the other hand, a curve B in FIG. 5 represents the I–V characteristics of the conventional solar cell of FIGS. 6(a) and 6(b) that was produced by the production method of the prior art shown in FIGS. 7(a) to 7(d). The solar cell exhibiting the I–V characteristics of the curve B had a light reception surface (effective area) of 0.25 cm$^2$. The solar cell comprised an about 1 $\mu$m-thick molybdenum layer 102 formed on a glass substrate 100, an about 2 $\mu$m-thick p-type semiconductor layer 104 of CuInS$_2$ having a Cu/In atomic ratio of 1.6 before the KCN treatment, an 80 to 120 nm-thick n-type semiconductor layer 106 of ZnS and an about 1 $\mu$m-thick transparent electrode 18 of ZnO doped with Al.

It is obvious from FIG. 5 that the I–V characteristics of the solar cell of FIGS. 2(a) and 2(b) and the solar cell of FIGS. 3(a) and 3(b) each produced by the production method shown in FIGS. 1(a) to 1(f) were better than the I–V characteristics of the conventional solar cell shown in FIGS. 6(a) and 6(b). Power generation efficiency derived from the I–V characteristics shown in FIG. 5 was 11.7% in the case of the solar cell shown in FIGS. 2(a) and 2(b) and was 11.0% in the case of the solar cell shown in FIGS. 3(a) and 3(b). In contrast, power generation efficiency of the conventional solar cell shown in FIGS. 6(a) and 6(b) was 9.7%.

As described above, the present invention can increase the Cu/In atomic ratio of the p-type semiconductor layer before the KCN treatment to a value higher than that of the compound semiconductor solar cell having the p-n junction according to the prior art. Since the present invention can increase the thickness of the p-type semiconductor layer obtained finally to a larger thickness than that of the conventional p-type semiconductor layer, it can improve crytallinity inside the p-type semiconductor layer. Therefore, power generation efficiency of the compound semiconductor solar cell according to the present invention is higher than power generation efficiency of the compound semiconductor solar cell according to the prior art. In other words, the present invention can contribute to making the compound semiconductor solar cell wide-spread.

What is claimed is:

1. A production method of a compound semiconductor solar cell including the steps of:

laminating an indium layer and a copper layer on an electrode film formed on one of the surfaces of a substrate to form a metallic film, and subjecting said metallic film to sulfurization treatment or selenization treatment to form a p-type semiconductor layer made of CuInS$_2$ or CuInSe$_2$ and subjecting said p-type semiconductor layer to KCN treatment to remove copper sulfide or copper selenide by a KCN solution, and then forming an n-type semiconductor layer on said p-type semiconductor layer;

said production method characterized in that said indium layer is formed under heating, wherein the heating temperature when said indium layer is formed under heating is such that said substrate is heated to 120 to 220° C.

2. A production method of a compound semiconductor solar cell according to claim 1, wherein the heating temperature is such that said substrate is heated to 140 to 190° C.

3. A production method of a compound semiconductor solar cell according to claim 1, wherein said metallic film formed by laminating said indium layer and said copper layer is constituted in such a fashion that a Cu/In atomic ratio of copper (Cu) to indium (In) forming said p-type semiconductor layer before said KCN treatment is at least 1.8.

4. A production method of a compound semiconductor solar cell according to claim 1, wherein said p-type semiconductor layer before said KCN treatment is formed to a thickness greater an the thickness of said p-type semiconductor layer formed finally, and is etched to a thickness by chemical etching after said KCN treatment.

5. A production method of a compound semiconductor solar cell according to claim 1, wherein said metallic film formed by laminating said indium layer and said copper layer is constituted in such a fashion that the thickness of said p-type semiconductor layer after said KCN treatment is 2 to 10 $\mu$m.

6. A production method of a compound semiconductor solar cell including the steps of:

laminating a gallium layer or a gallium-copper alloy layer, an indium layer and a copper layer on an electrode film formed on one of the surfaces of a substrate to form a metallic film, and subjecting said metallic film to sulfurization treatment or selenization treatment to form a p-type semiconductor layer made of Cu(In, Ga)S$_2$ or Cu(In, Ga)Se$_2$; and subjecting said p-type semiconductor layer to KCN treatment for removing copper sulfide or copper selenide by a KCN solution, and then forming an n-type semiconductor layer on said p-type semiconductor layer;

said production method characterized in that said indium layer is formed under heating, or the formed indium layer is heat-treated by a heat-treatment while the surface of said indium layer is exposed.

7. A production method of a compound semiconductor solar cell according to claim 6, wherein the heating temperature when said indium layer is formed under heating or the heating temperature when said indium layer is heat-treated by said heat-treatment is such that said substrate is heated to 120 to 220° C.

8. A production method of a compound semiconductor solar cell according to claim 6, wherein said metallic film formed by laminating said gallium layer or said gallium-copper alloy layer, said indium layer and said copper layer is constituted in such a fashion that a Cu/In atomic ratio of copper (Cu) to indium (In) forming said p-type semiconductor layer before said KCN treatment is at least 1.8.

9. A production method of a compound semiconductor solar cell according to claim 6, wherein the heating temperature when said indium layer is formed under heating or the heating temperature when said indium layer is heat-treated by said heat-treatment is such that said substrate is heated to 120 to 220° C., and said metallic film formed by laminating said gallium layer or said gallium alloy layer, said indium layer and said copper layer is constituted in such a fashion that a Cu/In atomic ratio of copper (Cu) to indium (In) forming said p-type semiconductor layer before said KCN treatment is at least 1.8.

10. A production method of a compound semiconductor solar cell according to claim 6, wherein said p-type semiconductor layer before said KCN treatment is formed to a thickness greater than the thickness of said p-type semiconductor layer finally formed, and it etched to a thickness by chemical etching after said KCN treatment.

11. A production method of a compound semiconductor solar cell according to claim 6, wherein said metallic film formed by laminating said gallium layer or said gallium-copper alloy layer, said indium layer and said copper layer is constituted in such a fashion that the thickness of said p-type semiconductor layer after said KCN treatment is 2 to 10 $\mu$m.

12. A compound semiconductor solar cell including a p-type semiconductor layer and an n-type semiconductor layer formed serially on an electrode film formed on one of the surfaces of a substrate, characterized in that said p-type semiconductor layer is mainly made of copper (Cu) and indium (In), and a thin film metal layer comprising gold (Au), platinum (Pt), or palladium (Pd), which has a thickness smaller than the thickness of said p-type semiconductor layer, is formed between said electrode film and said p-type semiconductor layer.

13. A compound semiconductor solar cell according to claim 12, wherein said thin film metal layer is made of at least one of gold (Au), platinum (Pt) and palladium (Pd), or is an alloy comprising at least two of gold (Au), platinum (Pt) and palladium (Pd).

14. A compound semiconductor solar cell according to claim 13, wherein the thickness of said thin film metal layer is at least 2 nm.

15. A compound semiconductor solar cell according to claim 14, wherein the thickness of said thin film metal layer is 5 to 200 nm.

16. A compound semiconductor solar cell according to claim 12, wherein said electrode film is made of molybdenum (Mo) formed on one of the surfaces of a glass substrate, and said p-type semiconductor layer is made of $CuInS_2$ or $CuInSe_2$.

17. A compound semiconductor solar cell according to claim 12, wherein said electrode film is made of molybdenum (Mo) formed on one of the surfaces of a glass substrate, and said p-type semiconductor layer is made of $Cu(In, Ga)S_2$ or $Cu(In, Ga)Se_2$.

18. A production method of a compound semiconductor solar cell including the steps of:
laminating an indium layer and a copper layer on an electrode film formed on one of the surfaces of a substrate to form a metallic film and subjecting said metallic film to sulfurization treatment or selenization treatment to form a p-type semiconductor layer made of $CuInS_2$ or $CuInSe_2$; and
subjecting said p-type semiconductor layer to KCN treatment for removing copper sulfide or copper selenide by a KCN solution, and then forming an n-type semiconductor layer on said p-type semiconductor layer;
said production method characterized in that a thin film metal layer comprising gold (Au), platinum (Pt), or palladium (Pd), which has a thickness smaller than the thickness of said p-type semiconductor layer, is formed on the surface of said electrode film, and then a metallic film comprising an indium layer and a copper layer is formed on the surface of said thin film metal layer.

19. A production method of a compound semiconductor solar cell including the steps of:
laminating a gallium layer or a gallium-copper alloy layer, an indium layer and a copper layer on an electrode film formed on one of the surfaces of a substrate to form a metallic film and subjecting said metallic film to sulfurization treatment or selenization treatment to form a p-type semiconductor layer made of $Cu(In, Ga)S_2$ or $Cu(In, Ga)Se_2$; and
subjecting said p-type semiconductor layer to KCN treatment for removing copper sulfide or copper selenide by a KCN solution, and then forming an n-type semiconductor layer on said p-type semiconductor layer;
said production method characterized in that a thin film metal layer comprising gold (Au), platinum (Pt), or palladium (Pd), which has a thickness smaller than the thickness of said p-type semiconductor layer, is formed on the surface of said electrode film, and then a metallic film comprising a gallium layer or a gallium-copper alloy layer, an indium layer and a copper layer is formed on the surface of said thin film metal layer.

20. A production method of a compound semiconductor solar cell according to claim 18, wherein said thin film metal layer is made of at least one of gold (Au), platinum (Pt) and palladium (Pd), or is an alloy comprising at least two of gold (Au), platinum (Pt) and palladium (Pd).

21. A production method of a compound semiconductor solar cell according to claim 18, wherein said metallic film of said indium layer and said copper layer is formed in such a fashion that a Cu/In atomic ratio of copper (Cu) to indium (In) forming said p-type semiconductor layer before said KCN treatment is at least 1.8.

22. A production method of a compound semiconductor solar cell according to claim 19, wherein said metallic film comprising said gallium layer or said gallium-copper alloy layer, said indium layer and said copper layer is formed in such a fashion that a Cu/In atomic ratio of copper (Cu) to indium (In) forming said p-type semiconductor layer before said KCN treatment is at least 1.8.

23. A production method for a compound semiconductor solar cell including the steps of:
laminating an indium layer and a copper layer on an electrode film formed on one of the surfaces of a substrate to form a metallic film, and subjecting said metallic film to sulfurization treatment or selenization treatment to form a p-type semiconductor layer made of $CuInS_2$ or $CuInSe_2$; and
subjecting said p-type semiconductor layer to KCN treatment to remove copper sulfide or copper selenide by a KCN solution, and then forming an n-type semiconductor layer on said p-type semiconductor layer;
said production method characterized in that the formed indium layer is heat-treated by a heat-treatment, the heating temperature of which is such that said substrate is heated to 120 to 220° C., while the surface of said indium layer is exposed, and said copper layer is formed on the surface of said indium layer after said heat-treatment.

* * * * *